(12) United States Patent
Isozaki

(10) Patent No.: US 8,350,593 B2
(45) Date of Patent: Jan. 8, 2013

(54) SEMICONDUCTOR CHIP AND SEMICONDUCTOR DEVICE

(75) Inventor: Tomoaki Isozaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/015,246

(22) Filed: Jan. 27, 2011

(65) Prior Publication Data

US 2011/0133803 A1 Jun. 9, 2011

Related U.S. Application Data

(62) Division of application No. 11/561,567, filed on Nov. 20, 2006, now Pat. No. 7,902,873.

(30) Foreign Application Priority Data

Nov. 21, 2005 (JP) ................................. 2005-336133

(51) Int. Cl.
*H03K 19/0175* (2006.01)
*H03K 19/0185* (2006.01)
*H03K 19/094* (2006.01)

(52) U.S. Cl. .............................. 326/83; 326/80; 327/333
(58) Field of Classification Search .................... 326/80, 326/81, 83, 102; 327/333; 257/685, 686
See application file for complete search history.

(56) References Cited

U.S. PATENT DOCUMENTS

| | | | | |
|---|---|---|---|---|
| 5,966,030 A | * | 10/1999 | Schmitt et al. | 326/83 |
| 6,064,229 A | * | 5/2000 | Morris | 326/81 |
| 6,130,557 A | * | 10/2000 | Drapkin et al. | 326/81 |
| 6,346,829 B1 | | 2/2002 | Coddington | |
| 6,429,686 B1 | * | 8/2002 | Nguyen | 326/86 |
| 7,173,472 B2 | | 2/2007 | Chen et al. | |
| 2005/0170600 A1 | | 8/2005 | Fukuzo | |

FOREIGN PATENT DOCUMENTS

JP 09-116416 A 5/1997
JP 2005-217205 A 8/2005

* cited by examiner

*Primary Examiner* — Daniel D Chang
(74) *Attorney, Agent, or Firm* — Sughrue Mion, PLLC

(57) ABSTRACT

A semiconductor device includes a first semiconductor chip operating at a first power supply voltage and a second semiconductor chip operating at a second power supply voltage lower than the first power supply voltage to supply the second power supply voltage to the first semiconductor chip. The semiconductor chips according to the present invention are conveniently used for fabrication of the semiconductor device. The first semiconductor chip includes an output circuit including a first transistor and a second transistor, interconnected in series and turned on or off complementarily. The output circuit outputs a signal to a first external output terminal. The first semiconductor chip also includes a third transistor connected in series with the first and second transistors and having a gate electrode connected to a second output terminal. The entire chip area is reduced, as compared with the case where plural semiconductor chips, operated at different operating voltages, are interconnected and used as such in a semiconductor device provided with an input/output buffer operating at a voltage different from the respective operating voltages resulting in an increased chip area.

8 Claims, 5 Drawing Sheets

SEMICONDUCTOR CHIP AND SEMICONDUCTOR DEVICE

CROSS REFERENCE TO RELATED APPLICATIONS

This application is a divisional of U.S. patent application Ser. No. 11/561,567 filed Nov. 20, 2006, which claims priority from Japanese Patent Application No. 2005-336133 filed Nov. 21, 2005, the contents of all of which are incorporated herein by reference in their entirety.

FIELD OF THE INVENTION

This invention relates to a semiconductor device and, more particularly, to a semiconductor device including two semiconductor chips. This invention may be applied to advantage especially in case the two chips of the semiconductor device operate at different operating voltages.

BACKGROUND OF THE INVENTION

It has been practiced in recent years to fabricate a semiconductor device of high functionality as a plural number of semiconductor chips with different functions are housed in one and the same package. This sort of the semiconductor device, termed a multichip package (MCP), is disclosed in Patent Document 1, for example. The MCP is stirring up notice in view of its merits that the semiconductor device may be fabricated more easily and more inexpensively than an SoC (System-on-Chip) in which a plural number of functions are integrated in one and the same chip.

An example of the MCP is one in which a logic chip and a memory chip are packaged together. As for the logic chip, its operating voltage has been lowered appreciably because miniaturization is going on at a rapid pace for achieving high performance and low power consumption. On the other hand, there is an occasion where a memory chip of only a small capacity may be sufficient for use in the MCP. Thus, the fabrication technique several generations before may be used for fabricating the memory chip of the small capacity. However, the operating voltage for such small-capacity memory chip may be relatively high from time to time.

In such case, plural semiconductor chips differing in the operating voltage may need to be used in combination.

If, when the semiconductor chips, differing in the operating voltage, are used in combination, the semiconductor chip having a higher operating voltage directly outputs a data signal, the operating voltage of which is HIGH, to the semiconductor chip having a lower operating voltage, there is a possibility of destruction of transistors constituting an input circuit of the receiving semiconductor chip operating at the lower operating voltage.

On the other hand, if the semiconductor chip, operating at a lower voltage, directly transmits a data signal, having the low voltage as a HIGH level signal, to the semiconductor chip operating at a high voltage, there is a possibility that the logic of an input circuit of the semiconductor chip operating at the higher voltage cannot be determined as normally.

Heretofore, the above problems have been dealt with in the following manner.

That is, the conventional practice in combining a memory chip, operating at 1.5V, with a logic chip operating at 1.0V, has been to provide a 3.3V power supply unit in each of the memory chip and the logic chip, and also to provide an input/output circuit, operating at 3.3V, within each of the chips. In short, a buffer circuit for equating the input/output voltages between the chips is provided in each of the chips.

[Patent Document 1] JP Patent Kokai Publication No. JP-P2005-217205A

SUMMARY OF THE DISCLOSURE

The present inventor has found that, with the above-described related art, in which a buffer circuit operating at a voltage different from the operating voltage has to be provided in each of the data transmitting side semiconductor chip and the data receiving side semiconductor chip, there is raised a problem that the respective semiconductor chips are necessarily increased in area.

For example, if a memory chip is to output a data signal with a data width of 16 bits, it is necessary to provide 16 buffer circuits, each operating at a voltage differing from the operating voltage, and hence a serious problem is raised in connection with the increasing chip area.

Meanwhile, the 'operating voltage' herein means a voltage used in driving the internal circuitry. The internal circuitry means a circuit for executing processing operations insofar as the logic chip is concerned, and means a memory cell circuit, an X-decoder, a Y-decoder and a sense amplifier insofar as the memory chip is concerned.

According to the present invention, the operating voltage of one of the semiconductor chips is supplied therefrom to the other semiconductor chip.

By this feature, the other semiconductor chip is able to generate a data signal of the one semiconductor chip the operating voltage of which is at the HIGH level. Thus, at least the one semiconductor chip is able to receive the data signal, the HIGH level of which is the own operating voltage, from the other semiconductor chip. Consequently, there is no necessity of separately providing a buffer circuit operating at a voltage different from the own operating voltage.

According to a first aspect of the present invention, for example, there is provided a semiconductor device including a first semiconductor chip operating at a first power supply voltage, and a second semiconductor chip operating at a second power supply voltage lower than said first power supply voltage. The second semiconductor chip supplies the second power supply voltage to the first semiconductor chip.

The first semiconductor chip may include: an output circuit that outputs a signal to the second semiconductor chip; and a voltage supplying circuit that receives the second power supply voltage from the second semiconductor chip and supplies the second power supply voltage to the output circuit.

The voltage supplying circuit may receive the first power supply voltage and outputs the second power supply voltage.

It is preferred that the voltage supplying circuit is a MOSFET connected between a power supply line supplying the first power supply voltage and the output circuit; and the second power supply voltage is supplied as input to the gate of the MOSFET.

Preferably, the output circuit includes first and second transistors turned on or off complementarily; and the voltage supplying circuit is connected between the first and second transistors.

The voltage supplying circuit may be a MOSFET having a gate supplied with the second power supply voltage.

The semiconductor device may further comprise: an external terminal electrically interconnecting the first and second semiconductor chips; and the voltage supplying circuit may comprise a line interconnecting the output circuit and the external terminal.

The output circuit may include first and second transistors turned on or off complementarily; and the second power supply voltage may be supplied to the source or drain of the first transistor.

The first semiconductor chip may include: an input circuit operating at two power supply voltages, that is, the first power supply voltage, and the second power supply voltage that is supplied from the second semiconductor chip.

The output circuit and the input circuit may transmit and receive signals to and from the second semiconductor chip over the same external terminal.

According to a second aspect of the present invention, there is also provided a semiconductor chip conveniently used in the semiconductor device. The semiconductor chip includes an output circuit including a first transistor and a second transistor, being interconnected in series and turned on or off complementarily. The output circuit outputs a signal to a first external output terminal. The semiconductor chip also includes a third transistor connected in series with the first and second transistors and having a gate terminal connected to a second external output terminal.

In the second aspect, i.e., in the semiconductor chip, the third transistor may be connected between the first and second transistors.

The semiconductor chip may further comprise: a first power supply voltage supply source; the third transistor being connected between the first power supply voltage supply source and the first transistor.

The semiconductor chip may further comprise: a first power supply voltage supply source; and an internal circuit outputting a signal to the output circuit; the first transistor having one terminal connected to the first power supply voltage supply source; the internal circuit operating by a voltage supplied from the first power supply voltage supply source.

The semiconductor chip may further comprise: an internal circuit operating by a voltage supplied from the first power supply voltage supply source; the internal circuit outputting a signal to the output circuit.

In the semiconductor chip, the third transistor may output a voltage, applied to a gate electrode thereof, at one terminal thereof.

The threshold value of the third transistor may be substantially 0V.

The semiconductor chip may further comprise: an input circuit having an input terminal connected to the first external terminal; the input circuit being driven by two voltages, namely a voltage supplied by the first power supply voltage supply source and a voltage entered to the second external terminal.

The first and second transistors may constitute a tristate buffer.

The voltage applied to the second external terminal may be lower than the voltage supplied from the first power supply voltage supply source.

The meritorious effects of the present invention are summarized as follows.

According to the present invention, since there is no necessity for providing a buffer circuit or circuits operating at a voltage or voltages different from the operating voltage, the semiconductor chip, and thus the semiconductor device, may be reduced in size.

PREFERRED MODES FOR CARRYING OUT THE INVENTION

An example of the present invention will now be described with reference to FIG. 1.

Figure 1:
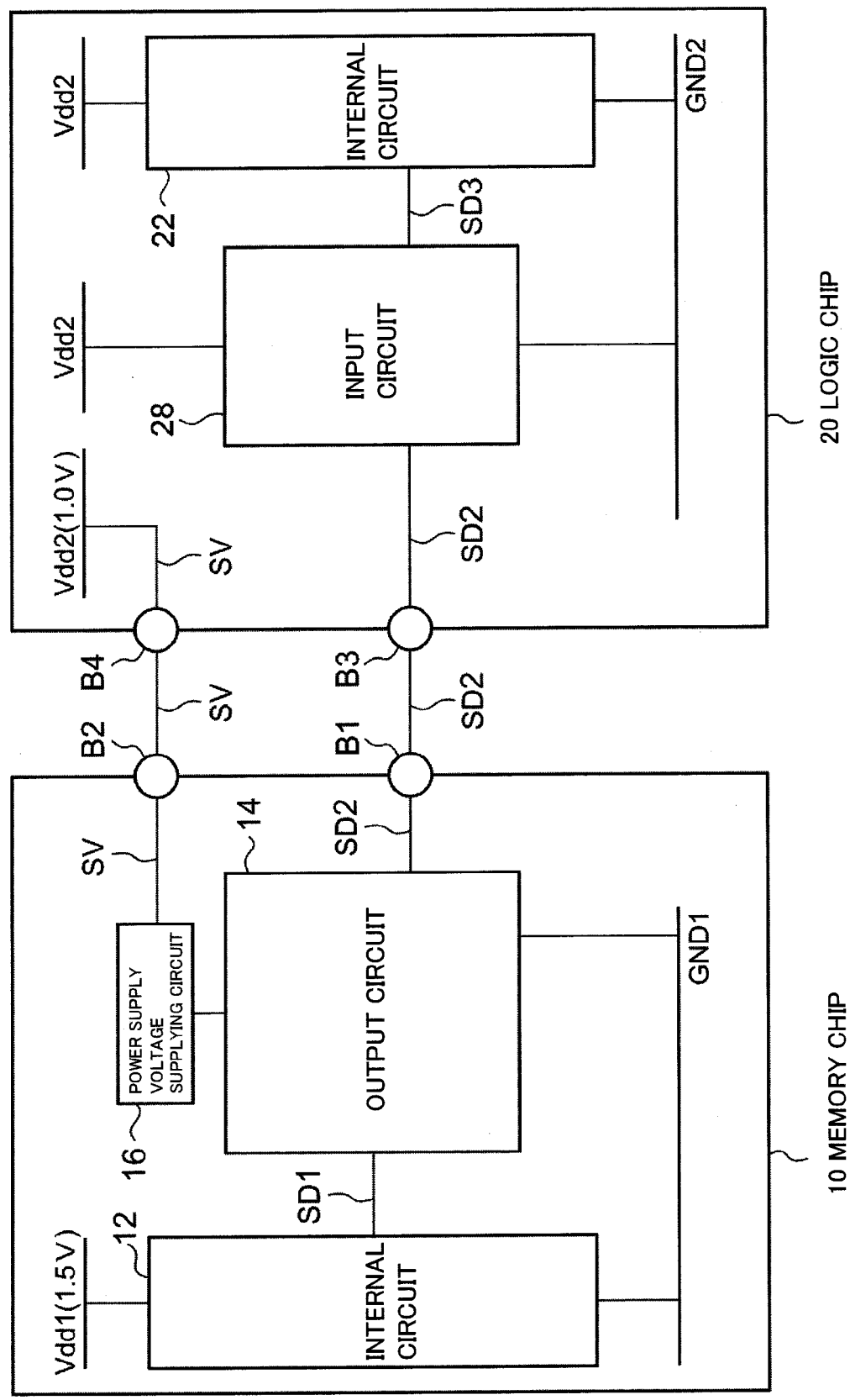
FIG. 1 is a diagram for illustrating a preferred mode for carrying out the present invention.

FIG. 1 schematically shows a semiconductor device 100 according to a first example of the present invention.

The semiconductor device 100 includes a first semiconductor chip 10 and a second semiconductor chip 20. In the following, the present first example will be described with the first semiconductor chip 10 being a memory chip (first sort of chip) and with the second semiconductor chip 20 being a logic chip (second sort of chip). However, the present invention is not to be limited to these particular sorts of the semiconductor chips.

The memory chip 10 includes an internal circuit 12 including e.g., memory cells, decoders and sense amplifiers, not shown. The internal circuit 12 is connected to a power supply line Vdd1, as a first power supply voltage supply source, and outputs a data signal SD1, the HIGH level of which is the first power supply voltage supplied by the power supply line Vdd1. That is, the internal circuit 12 has the first power supply voltage, supplied by the power supply line Vdd1, as an operating voltage. In the following explanation of the present example, the first power supply voltage is assumed to be 1.5V.

Meanwhile, the power supply line, denoted by the same reference numeral, herein means an interconnection (wiring) on which the same power supply voltage is transmitted. The interconnection may be one and the same line or may also be separate lines, provided that there is supplied the same power supply voltage on these lines.

The memory chip 10 includes an output circuit 14. The output circuit 14 receives a data signal SD1, output by the internal circuit 12, as its input, and outputs a data signal SD2 to a bump B1 as a first output terminal.

The memory chip 10 also includes a power supply voltage supplying circuit 16. The power supply voltage supplying circuit 16 receives, as input, a voltage signal SV, supplied to a bump B2, as a second external terminal, and transmits a voltage, which is the same as the voltage of the voltage signal SV, to the output circuit 14. This output circuit outputs a data signal SD2, the HIGH level of which is the voltage supplied from the power supply voltage supplying circuit 16, to the bump B1.

The logic chip 20 includes an internal circuit 22 configured so as to execute processing operations. The internal circuit 22 is connected to a power supply line Vdd2, as a second power supply voltage supply source, and has a second power supply voltage, supplied by the power supply line Vdd2, as its operating voltage. The second power supply voltage is lower than the first power supply voltage. In the present example, the second power supply voltage is assumed to be 1.0V.

The logic chip 20 also includes an input circuit 28 having a second power supply voltage (Vdd2) as its operating voltage. The input circuit 28 has the data signal SD2, transmitted thereto from the memory chip 10 via bump B3, as a third external terminal, and outputs a data signal SD3, the HIGH level of which is the second power supply voltage, to the internal circuit 22. It is noted that, when the memory chip 10 and the logic chip 20 are interconnected by flipchip connection, the bumps 1 and 2 denote the same bump.

The logic chip 20 also includes a bump B4 as a fourth external terminal. The bump B4 is connected to the power supply line Vdd2, while being electrically connected to the bump B2 of the memory chip 10. That is, the logic chip 20 supplies the second power supply voltage to the memory chip 10 via bumps B4 and B2. Specifically, the logic chip 20 transmits the second power supply voltage to the power supply voltage supplying circuit 16 of the memory chip 10.

The operation of the memory chip 10 will now be described in association operatively with the logic chip 20.

Initially, the power supply voltage supplying circuit 16 receives the voltage of 1.0V from the logic chip 20, via bumps B2, B4, to output 1.0V to the output circuit 14.

On the other hand, the internal circuit 12 of the memory chip 10 receives the voltage of 1.5V from the power supply line Vdd1, to output the data signal SD1, the HIGH level of which is 1.5V, to the output circuit 14.

The output circuit 14 receives the power supply voltage of 1.0V from the power supply voltage supplying circuit 16, and outputs the data signal SD2, the HIGH level of which is 1.0V, to the logic chip 20, based on the data signal SD1 entered from the internal circuit 12.

The input circuit 28 of the logic chip 20 receives the data signal SD2, as input, from the memory chip 10. At this time, the HIGH level of the data signal SD2 is 1.0V which is the operating voltage of the logic chip 20 itself. Hence, there is no risk of malfunctions or transistor destruction even if the data signal is received by e.g., an inverter operating at 1.0V. Consequently, there is no necessity for providing an input buffer circuit, operating at a voltage different from the operating voltage of the logic chip 20, such as 3.3V, in the logic chip 20, with the result that the chip may be reduced in size.

Figure 2:
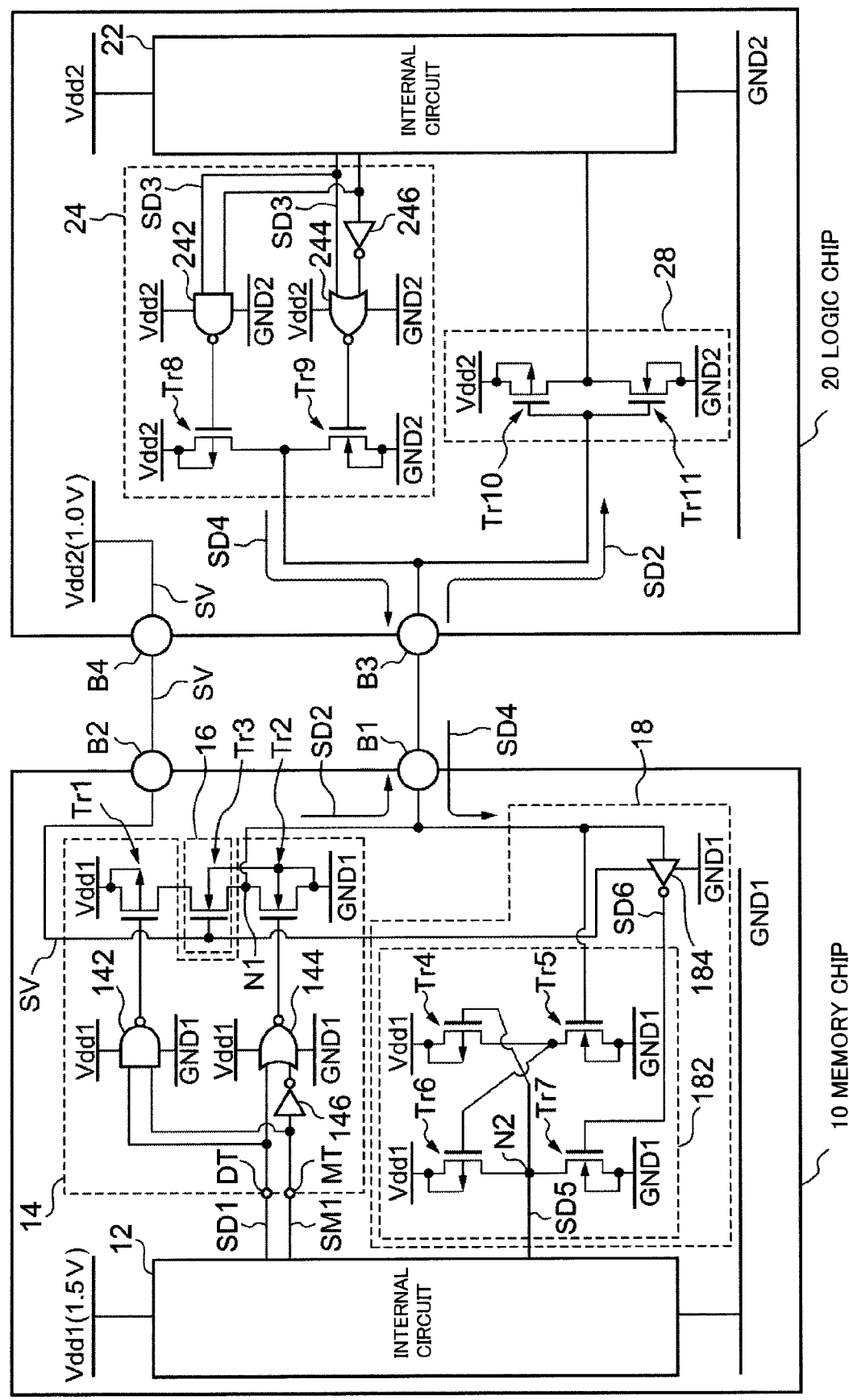
FIG. 2 is a diagram for illustrating a first example of the present invention.

FIG. 2 shows a semiconductor device 200 according to the first example of the present invention. In FIG. 2, the same parts or components as those of FIG. 1 are denoted by the same reference numerals, and description therefor is omitted from time to time.

The output circuit 14 of the memory chip 10 includes a pair of transistors Tr1, Tr2 turned on or off complementarily. In the instant example, the transistors Tr1, Tr2 are assumed to be a PMOS transistor and an NMOS transistor, respectively.

In the output circuit 14, a tri-state buffer circuit is constituted by the transistors Tr1, Tr2, a NAND 142, a NOR 144 and an inverter 146.

Meanwhile, the output circuit 14 may be constituted not by the tri-state buffer circuit but by an inverter formed by the transistors Tr1, Tr2.

A power supply voltage supplying circuit 16 comprises an NMOS transistor Tr3. This NMOS transistor Tr3 is connected in series between the PMOS transistor Tr1 and the NMOS transistor Tr2. To the gate electrode of the NMOS transistor Tr3 is applied 1.0V, as the power supply voltage of the logic chip 20, via bump B2.

A node N1, as a junction point between the source terminal of the NMOS transistor Tr3 and the drain terminal of the NMOS transistor Tr2, is an output terminal of the output circuit 14, and is connected to the bump B1.

In a channel region of the NMOS transistor Tr3, no impurity is doped, such that its on-voltage is substantially 0V. Hence, the NMOS transistor Tr3 operates as a circuit which clamps the voltage applied to its drain terminal and which outputs the voltage applied to its gate electrode to its source terminal.

The transistors Tr1, Tr2 and Tr3 will be described in further detail. The back gate of the PMOS transistor Tr1 is connected to the power supply line Vdd1 and biased at 1.5V. The back gates of the NMOS transistors Tr2, Tr3 are connected to the ground GND1 and biased to the ground potential.

The operation of the output circuit 14 will now be described.

When a mode selection signal SM1 of the HIGH level (1.5V) is entered from the internal circuit 12 to a mode selection terminal MT of the output circuit 14, the output circuit 14 enters into an output mode. The output circuit 16 outputs, at the node N1, the data signal SD2, which becomes HIGH or LOW responsive to the data signal SD1 transmitted to a data terminal DT as input signal. The data signal SD2 is transmitted via bumps B1, B3 to the input circuit 28 of the logic chip 20.

When the mode selection signal SM1 becomes LOW, the output of the NAND 142 becomes HIGH, while the output of the NOR 144 becomes LOW, without dependency upon the logic entered to the data terminal DT. Hence, the PMOS transistor Tr1 and the NMOS transistor Tr2 are both turned off, with the node N1 being of high impedance. In this state, the memory chip 10 receives the data signal by the input circuit 18 via bump B1.

More specifically, if the output circuit 14 is in the output mode, and the HIGH level has been entered to the data terminal DT, the outputs of the NAND 142 and the NOR 144 become LOW in level. Hence, the PMOS transistor Tr1 and the NMOS transistor Tr2 are turned on and off, respectively.

Hence, the voltage of 1.5V, which is the operating voltage of the memory chip 10, is applied from the power supply line Vdd1 to the drain terminal of the NMOS transistor Tr3 via PMOS transistor Tr1.

It is noted that the voltage of 1.0V is supplied from the logic chip 20 to the gate electrode of the NMOS transistor Tr3 via bump B2. Hence, the voltage of 1.0V is output to the source terminal of the NMOS transistor Tr3, that is, to the node N1. Consequently, the output circuit 14 is able to output a data signal, having the HIGH level of 1.0V, which is the operating voltage of the logic chip 20.

On the other hand, if the LOW level is applied to the data terminal DT under the output mode, the outputs of the NAND 142 and the NOR 144 both become HIGH in level, so that the PMOS transistor Tr1 and the NMOS transistor Tr2 are turned off and on, respectively. Thus, the ground voltage is applied to the node N1 via NMOS transistor Tr2, and hence the output circuit 14 outputs the LOW level.

As may be seen from the above description of the present example, the semiconductor chip (memory chip 10), supplied from the other semiconductor chip (logic chip 20) with the power supply voltage (1.0V) of the other semiconductor chip, may also be reduced in chip area. The reason may be summarized as follows: Heretofore, an output of an internal circuit is again received by an output buffer circuit, operating at 3.3V, different from the chip's own operating voltage, and subsequently output to outside the chip. Since a well for forming an output buffer circuit operating with the voltage of 3.3V and another well for forming an internal circuit operating with the voltage of 1.5V need to be electrically isolated from each other, those wells need to be provided separately. Additionally, for electrically isolating the wells from each other, it is necessary to provide a device isolation area, such as STI, of a larger size, and to provide some sizeable distance between the two wells. The result is an increased area of the semiconductor chip. With the present example, the NMOS transistor Tr3, as a power supply voltage supplying circuit, is provided in an output buffer circuit (output circuit 14 in the present example) operating at 1.5V, so that it is unnecessary to provide a separate output buffer circuit operating at 3.3V. The output buffer circuit, operating at 1.5V, may be formed in the well in which to form the internal circuit is to be formed. Even supposing that the well for the output buffer operating at 1.5V be provided independently, it does not have to be separated so far from the well in which the internal circuit is to be formed. Thus, with the present invention, the semiconductor chip may be reduced in the chip area as compared to the technique of the related art.

The case in which the memory chip 10 receives the data signal from the logic chip 20 will now be described.

The internal circuit 22 of the logic chip 20 is connected to the power supply line Vdd2 and is in operation at 1.0V to output the data signal SD3 having the HIGH level of 1.0V to an output circuit 24.

The output circuit 24 of the logic chip 20 is connected to the power supply line Vdd2 and is in operation at 1.0V to output a data signal SD4, having the HIGH level of 1.0V, responsive to the data signal SD3 entered from the internal circuit 22.

The data signal SD4, output from the output circuit 24 of the logic chip 20, is entered via bumps B3, B1 to the input circuit 18 of the memory chip 10. That is, the bumps B1 and B3 are external terminals used for both inputting and outputting simultaneously.

The input circuit 18 of the memory chip 10 is made up of a flipflop circuit 182 and an inverter 184. The flipflop circuit is composed of PMOS transistors Tr4, Tr6 and NMOS transistors Try, Tr7. The input circuit 18 outputs a voltage at a node N2 between the PMOS transistor Tr6 and the NMOS transistor Tr7 as a data signal SD5 to the internal circuit 12.

The flipflop circuit 182 operates at 1.5V to output the data signal SD5, the HIGH level of which is 1.5V. On the other hand, the inverter 184 receives the voltage from the bump B2 so as to be operated at 1.0V to output a signal SD6, the HIGH level of which is 1.0V, to the NMOS transistor Tr7.

The operation of the input circuit 18 is such that, when the data signal SD4, transmitted to the bump B1, is HIGH in level, the circuit outputs 1.5V, as HIGH level, to the node N2. When the data signal SD4 is LOW in level, the circuit outputs the LOW level to the node N2.

Since the input circuit 18 of the memory chip 10 is constructed as described above, the signal SD4, the HIGH level of which is 1.0V, may be converted into a signal, the HIGH level of which is 1.5V, without generating the static flowing-through current.

Figure 3:
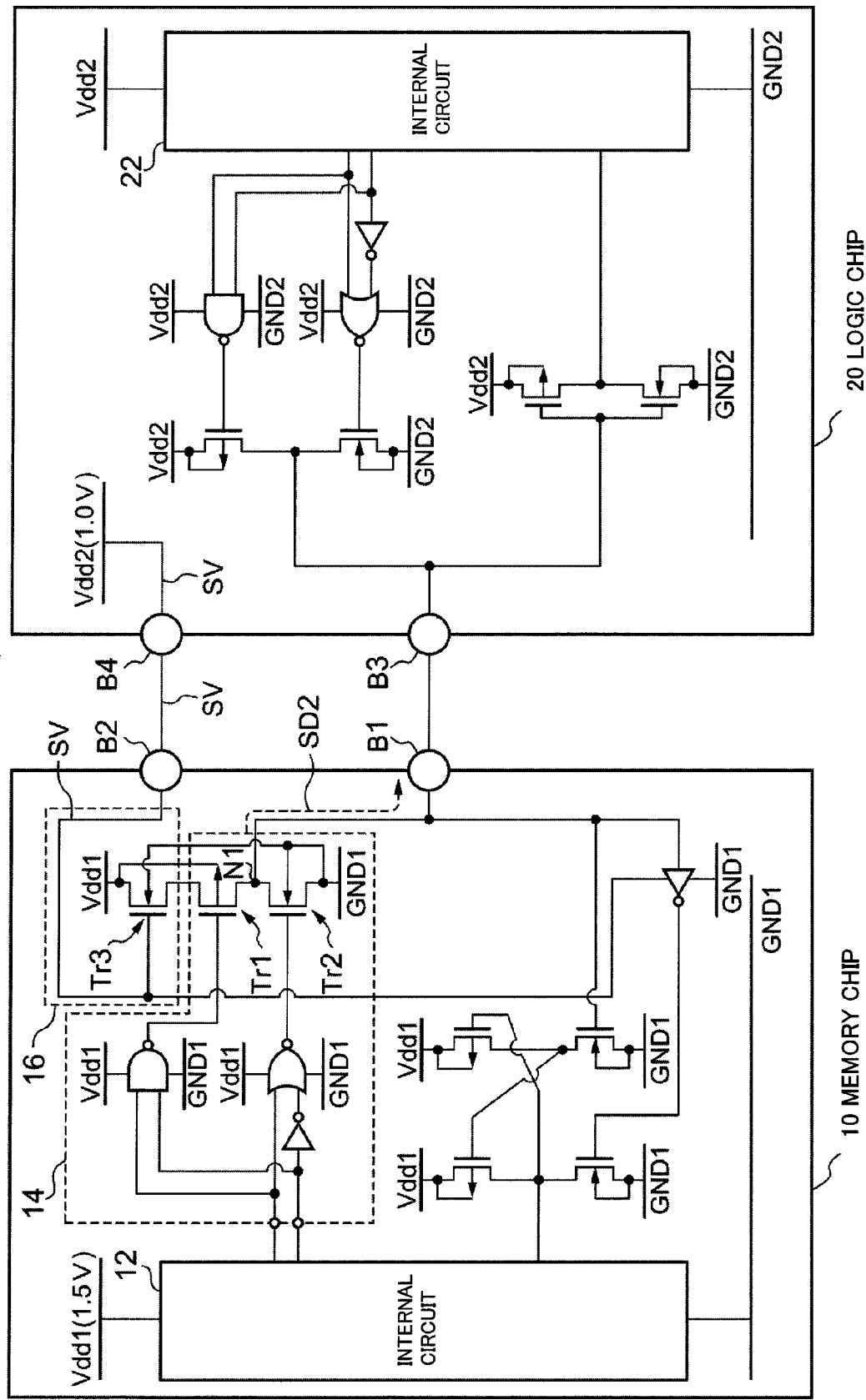
FIG. 3 is a diagram for illustrating a second example of the present invention.

A semiconductor device 300, according to a second example of the present invention, will now be described with reference to FIG. 3.

The present example differs from the first example as to the point of connection of the NMOS transistor Tr3 operating as the power supply voltage supplying circuit 16. In the present example, the NMOS transistor Tr3 is connected between the power supply line Vdd1 and the PMOS transistor Tr1. With this constitution, 1.5V is applied to the drain terminal of the NMOS transistor Tr3, the source terminal of which outputs 1.0V which is the voltage applied to its gate terminal.

That is, the output circuit 14 receives 1.0V from the NMOS transistor Tr3 to output the data signal SD2 having the HIGH level of 1.0V.

The present example is otherwise the same as the first example described above.

Figure 4:
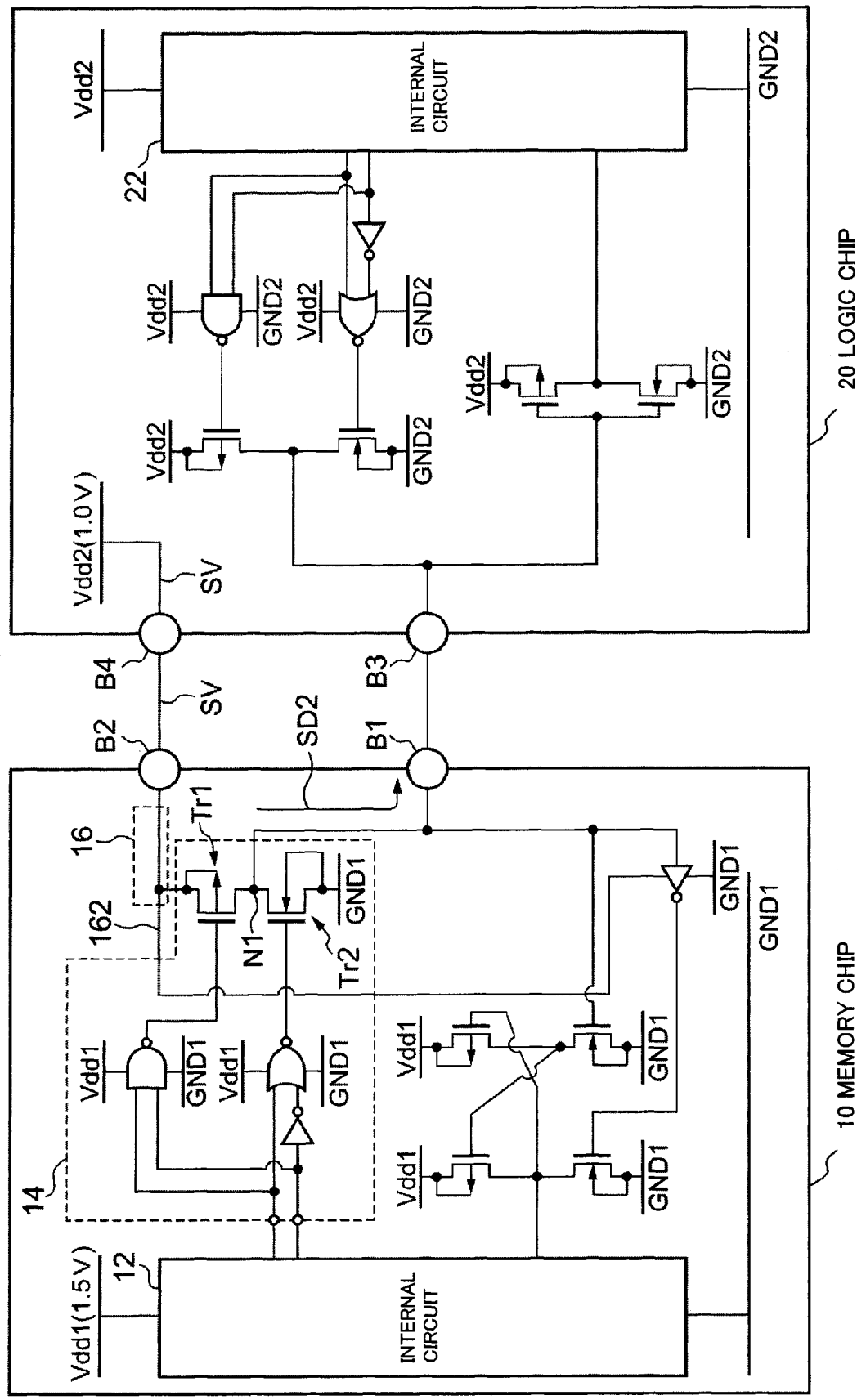
FIG. 4 is a diagram for illustrating a third example of the present invention.

A semiconductor device 400, according to a third example of the present invention, will now be described with reference to FIG. 4.

In the present example, the source terminal of the PMOS transistor Tr1 of the output circuit 14 is directly connected over a line 162 to the bump B2. That is, the line 162 operates as the power supply voltage supplying circuit 16.

With the above constitution, the output circuit 14 is supplied with 1.0V from the logic chip 20 over bump B2 and line 162, to output the data signal SD2, the HIGH level of which is 1.0V.

(Contrasting the First and Third Examples)

The third example has an advantage over the first example that there is no necessity of providing the NMOS transistor Tr3 and hence the third example may be simplified in constitution. On the other hand, the first example has an advantage over the third example that it may be reduced in circuit area. The reason for the above will now be described with reference to FIG. 5.

Figure 5A:
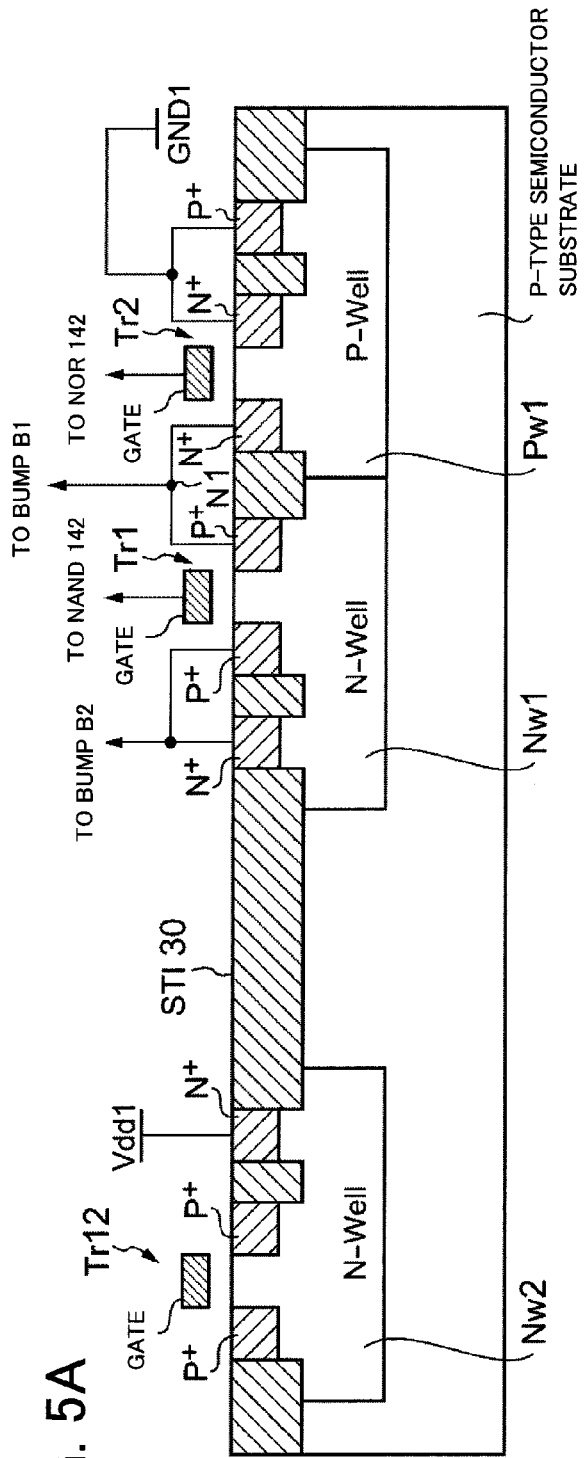
FIGS. 5A and 5B are diagrams for comparing the first and third examples of the present invention.

FIG. 5A depicts a partial cross-sectional view of a semiconductor device 400 according to the third example of the present invention. Referring to the circuit diagram of FIG. 4, the PMOS transistor Tr1, constituting the output circuit 14, has a back gate connected to the bump B2 so as to be thereby biased to 1.0V. On the other hand, a PMOS transistor Tr12, constituting the NAND 142 or the NOR 144, has a back gate biased to 1.5V.

Thus, an N-well Nw1, in the inside of which is formed the PMOS transistor Tr1, and an N-well Nw2, in the inside of which is formed the PMOS transistor Tr12, constituting the NAND 142 or the NOR 144, need to be electrically isolated from each other, as shown in FIG. 5A. However, if the N-wells Nw1 and Nw2, differing in potential from each other, are to be isolated from each other, it would be necessary to provide STI (Shallow Trench Isolation) 30, for example.

Figure 5B:
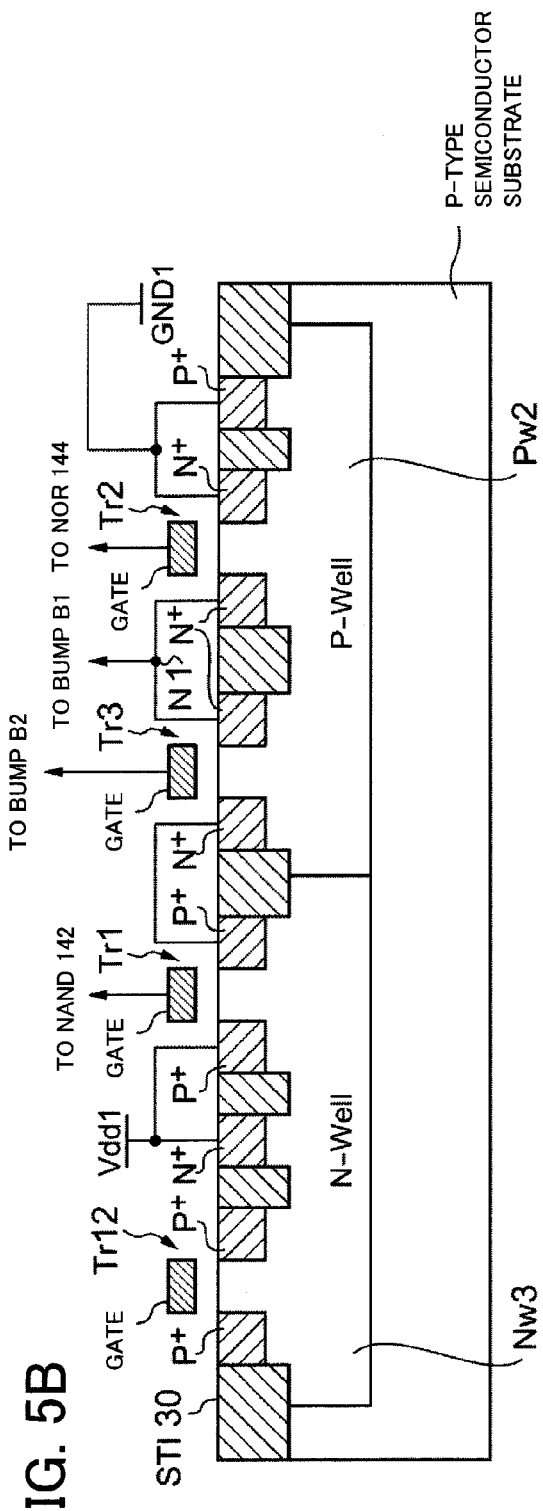

FIG. 5B depicts a partial cross-sectional view of the semiconductor device 200 according to the first example of the present invention.

Referring to the circuit diagram of FIG. 2, the back gate of the PMOS transistor Tr1 is connected to the power supply line Vdd1 so as to be biased to 1.5V. Consequently, the PMOS transistor Tr12, constituting the NAND 142 or the NOR 144, for example, and the PMOS transistor Tr1, may be formed in one and the same N-well Nw3, as shown in FIG. 5B, so that it is unnecessary to provide the STI in order to electrically isolate the N-wells, having the differential potential, from each other (refer to FIG. 5A).

With the output circuit 14 of the first example, it is necessary to provide one more NMOS transistor, namely the NMOS transistor Tr3, as compared to the output circuit of the third example. In general, a MOS transistor takes up a smaller space than in the case of STI used for isolating the N-wells Nw1 and Nw2 having different potentials. Thus, with the semiconductor device of the first example, the circuit area may be smaller than that of the semiconductor device of the third example.

It is to be noted that the present invention is not limited to the above-described examples, and may optionally be modified without departing from the spirit and scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor chip comprising:
an output circuit including a first transistor and a second transistor, being interconnected in series and turned on or off complementarily, said output circuit outputting a signal to a first external terminal; and a third transistor connected in series with said first and second transistors and having a gate terminal connected to a second external terminal which is connected to a power supply of an external circuit, wherein said third transistor is connected between said first and second transistors, a first power supply voltage supply source; and an internal circuit outputting a signal to said output circuit;

said first transistor having one terminal connected to said first power supply voltage supply source;

said internal circuit comprising:
    a first internal circuit unit which outputs to a gate of said first transistor and
    a second internal circuit unit which outputs to a gate of said second transistor,
wherein both said first and second internal circuits operating by a voltage supplied from said first power supply voltage supply source.

2. The semiconductor chip according to claim 1 further comprising:
    said third transistor being connected between said first power supply voltage supply source and said first transistor.

3. The semiconductor chip according to claim 2 further comprising:
    an input circuit having an input terminal connected to said first external terminal; said input circuit being driven by two voltages, namely a voltage supplied by said first power supply voltage supply source and a voltage entered to said second external terminal.

4. The semiconductor chip according to claim 2 wherein the voltage applied to said second external terminal is lower than the voltage supplied from said first power supply voltage supply source.

5. The semiconductor chip according to claim 1 wherein said third transistor outputs a voltage, applied to a gate electrode thereof, at one terminal thereof.

6. The semiconductor chip according to claim 5 wherein the threshold value of said third transistor is substantially 0V.

7. The semiconductor chip according to claim 1 wherein said first and second transistors constitute a tristate buffer.

8. The semiconductor chip according to claim 1 wherein the second external terminal is connected to a power supply rail of the external circuit.

* * * * *